(12) United States Patent
Shimomura

(10) Patent No.: US 6,710,377 B2
(45) Date of Patent: Mar. 23, 2004

(54) LIGHT EMITTING DEVICE HAVING A SILICONE RESIN

(75) Inventor: Kenji Shimomura, Kitakyushu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/119,413

(22) Filed: Apr. 9, 2002

(65) Prior Publication Data
US 2002/0145152 A1 Oct. 10, 2002

(30) Foreign Application Priority Data
Apr. 9, 2001 (JP) ......................... 2001-110675

(51) Int. Cl.$^7$ ............................................. H01L 29/22
(52) U.S. Cl. ..................... 257/99; 257/100; 257/81; 257/684; 257/788; 257/791
(58) Field of Search ..................... 257/99, 100, 81, 257/684, 788, 791

(56) References Cited

U.S. PATENT DOCUMENTS 5,430,330 A * 7/1995 Takahama et al. .......... 257/788
5,832,600 A * 11/1998 Hashimoto .................. 29/841
5,861,680 A * 1/1999 Yamanaka .................. 257/787

FOREIGN PATENT DOCUMENTS

JP 62054974 A * 3/1987 ........... H01L/31/12

* cited by examiner

Primary Examiner—Nathan Flynn
Assistant Examiner—Pershelle Greene
(74) Attorney, Agent, or Firm—Hogan & Hartson LLP

(57) ABSTRACT

A light emitting device includes a semiconductor light emitting element and a silicone resin provided to embed said semiconductor light emitting element, where silicone resin has a hardness not lower than 50 in JISA value. The use of a silicone resin as the resin for sealing the semiconductor light emitting elements instead of conventional epoxy resins can reduce the possibility of cracks, exfoliation, breakage of wire, etc. that were often caused by conventional epoxy resins, and can also improve the resistance to whether and light.

9 Claims, 7 Drawing Sheets

LIGHT EMITTING DEVICE HAVING A SILICONE RESIN

CROSS-REFERENCE TO RELATED APPLICATIONS

This application is based upon and claims the benefit of priority from the prior Japanese Patent Application No. 2001-110675, filed on Apr. 9, 2001; the entire contents of which are incorporated herein by reference.

BACKGROUND OF THE INVENTION

This invention relates to a light emitting device, in particular, having a structure where a semiconductor light emitting element is sealed by a resin element.

Light emitting devices including LEDs (light emitting diodes) or other semiconductor light emitting have been widely used as various kinds of indicators, light sources, flat-type display devices, backlight of liquid crystal displays, and so forth.

The typical light emitting devices have a structure where a light emitting element is sealed by a resin in order to protect the element against a outer atmosphere or mechanical shocks.

FIG. 10 shows such a typical conventional light emitting device. The light emitting device shown here is of a so-called "surface mounting" type, including a package (resin stem) 800, semiconductor light emitting element 802 and sealing element 804 of a resin.

The resin stem 800 has a structure molding a pair of leads 805, 806 shaped from lead frames with a resin portion 803 of a thermoplastic resin. The resin portion 803 has an opening 801, and the semiconductor light emitting element 802 is place therein. Then the semiconductor light emitting element 802 is sealed with an epoxy resin 804.

The semiconductor light emitting element 802 is mounted on the lead 806. An electrode (not shown) of the semiconductor light emitting element 802 and the lead 805 are connected to each other by a wire 809. When en electric power is supplied to the semiconductor light emitting element 802 through those two leads 805, 806, the semiconductor light emitting element 802 emits light, and the light is extracted from an emission surface 812 via the epoxy resin 804.

The Inventor, however, made researches and has found that conventional light emitting devices of this type have still room for improvement from the viewpoint of reliability and long-time stability.

That is, through temperature cycle tests of 700 cycles under temperatures in the range from −40° C. to 110° C., various undesirable phenomena were observed, such as cracks C in the epoxy resin 804 as shown in FIG. 11, or exfoliation of the epoxy resin 804 at the interface I with the resin stem 800. In some cases, the semiconductor light emitting element 802 broke, or exfoliated from the mount surface, and the wire 809 cut down.

The light emitting device shown in FIG. 10 certainly meets the requirements currently in force, i.e., 100 cycles as the current level of temperature cycle tests requested for ordinary civilian uses, and 300 cycles for car-borne uses. However, for further improvement of the reliability toward the future uses, essential review is required.

The same circumstances commonly exist in all structures sealing semiconductor elements with epoxy resin, without being limited to that shown in FIG. 10.

As a result of a careful review of malfunctioning mechanisms, the inventor has realized that the epoxy resin 804 is physically hard and fragile and produces a large stress upon hardening and that there still exists room for improvement in the quality of close contact with the resin portion 803 of a thermoplastic resin that surrounds it.

SUMMARY OF THE INVENTION

The invention has been made upon recognition of those problems. It is therefore an object of the invention to provide a light emitting device of a type sealing a semiconductor light emitting element with a resin, which can improve the reliability and long-time stability, and can compactly mount a plurality of chips.

According to an embodiment of the invention, there is provided a light emitting device comprising: a semiconductor light emitting element; and a silicone resin provided to embed the semiconductor light emitting element, the silicone resin having a hardness not lower than 50 in JISA value.

The present application contemplates, with the term "silicone resin", any resin having as its skeleton a structure in which silicon atoms having organic radicals such as alkyl radicals or aryl radicals are alternately connected to oxygen atoms. Needless to say, those containing additive elements added to such skeletons are also included in "silicone resins".

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

Some embodiments of the invention will now be explained below with reference to the drawings.

Figure 1:
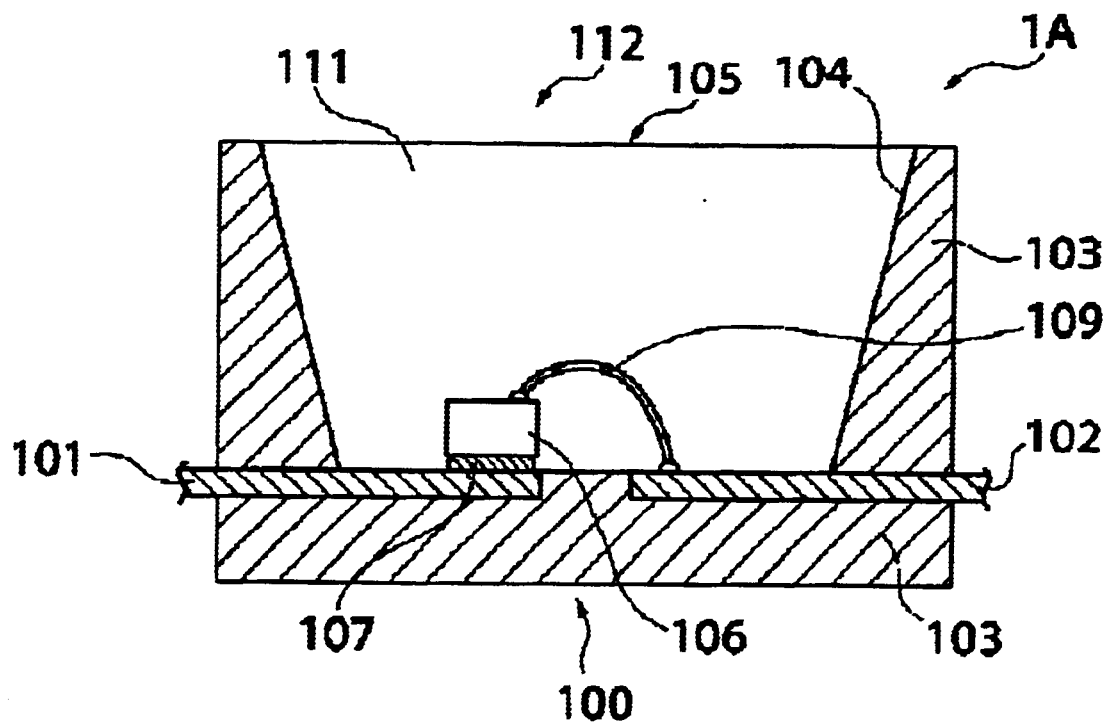
FIG. 1 shows schematic diagrams illustrating a cross-sectional configuration of the substantial part of a light emitting device according to the embodiment of the invention.

FIG. 1 shows schematic cross-sectional view illustrating a configuration of the substantial part of a light emitting device according to the first embodiment of the invention.

The light emitting device 1A shown here includes a resin stem 100, a semiconductor light emitting element 106 mounted on the resin stem 100 and a sealing element 111 provided to embed the element 106.

The resin stem 100 includes leads 101, 102 shaped from a lead frame, and a resin portion 103 molded integrally with the leads 101, 102.

The resin portion 103 is typically made of a thermoplastic resin preferably, for example, of a nylon system having inert coupling radicals.

The thermoplastic resin may be a resin having a high resistance to heat, such as liquid crystal polymer (LCP), polyphenylene sulfide (PPS: thermoplastic resin) or syndiotactic polystyrene (SPS: crystalline polystyrene). The plan-viewed outer configuration of the resin portion 103 may be a substantial square approximately sized 2.0×2.0 mm through 6.0×6.0 mm, or a substantial rectangular approximately sized 2.0×3.0 mm through 5.0×7.0 mm.

The leads 101, 102 have opposed ends close to each other, and extend therefrom in the opposite directions to outside the resin portion 103.

The resin portion 103 has formed an opening 105, and the semiconductor light emitting element 106 is mounted at the bottom of the opening 105. The plan-viewed shape of the opening 105 can be circular of approximately elliptical or approximately elongate-circular. The inner wall surface of the resin portion 103 surrounding the element 106 inclines to face toward the light extraction direction to function as a reflective surface 104 for reflecting light.

The light emitting element 106 is placed to deviate from the center of the bottom surface of the opening 105. The reason of this off-center arrangement is to ensure a enough space for boding wire 109, and to realize a high optical output by increasing the reflection efficiency by placing the element 106 close to the reflective surface 104.

The light emitting element 106 is mounted by an adhesive 107 such as silver (Ag) paste onto a lead 101 which is placed at the bottom of the opening 105. The element 106 has a electrode (not shown) on its surface, and is connected with the lead 102 by a bonding wire 109 such as a gold (Au) wire.

The invention uses a silicone resin instead of a conventional epoxy resin as the sealing element 111 filling the opening 105.

As compared with epoxy resins, silicone resins are less fragile and less subjected to cracks. Silicone resins usable in the present invention exhibit a high bonding force with the resin portion 103 made of a thermoplastic resin, for example, and a high moisture resistance. Additionally, they do not crack or exfoliate so much due to a temperature stress. Furthermore, such a silicone resin filled in the opening produces only a remarkably small resin stress to the light emitting element 106 and the Au wire 109. Moreover, silicone resins are more resistance to light irradiated from the light emitting element 106 than epoxy resins.

The Inventor further developed researches from those viewpoints. As a result, it has been found that the use of "rubber-like" silicone resin having a high hardness leads to an excellent result. Hardness of ordinary silicone resins ranges from 30 to 40 in JISA hardness value that is the hardness of the JIS standard. These silicone resins exhibit gel-like physical properties, and are physically soft. These silicone resins are hereinbelow called "gel-like silicone resins.

In contrast, "rubber-like silicone resins" have a JISA hardness in the range of approximately 50 to 90. Epoxy resins widely used as the sealing element materials in conventional light emitting devices have a JISA hardness around 95.

The Inventor compared and reviewed both "rubber-like silicone resins" and "gel-like silicone resins", and has got the following knowledge.

(1) Light emitting devices of the type shown in FIG. 1 normally need the process of soldering, called "reflow", for fixing outwardly projecting portions of the leads 101, 102 (called "outer leads", for example) to a packaging substrate locally covered with a solder. In that process using heat, gel-like silicone resins inevitably become soft, and actually, they often exfoliated at the interface with the resin portion 103.

In contrast, those phenomena did not occur with rubber-like silicone resins, and light emitting devices stably operated even under the temperature condition beyond 110° C.

(2) Since gel-like silicone resins are soft, although the stress they give to the light emitting element 106 and the wire 109 is small, they are weak against the external force. That is, the light emitting device as shown in FIG. 1 is used as a "surface-mounting type" lamp, for example, and mounted on a packaging substrate with an assembly apparatus. In this process, a vacuum collet of the assembly apparatus is often pressed against the surface of the sealing element 111. In case a gel-like silicone resin having a JISA hardness in the range of 30 to 40 is used, the sealing element 111 may be deformed by the pressing force from the vacuum collet, which in turn may deform the wire 109 or give a stress to the light emitting element 106.

In contrast, rubber-like silicone resins having a JISA hardness in the range of 50 to 90 are prevented from deformation by a selector or an assembler used for selecting or assembling light emitting devices.

As explained in Paragraphs (1) and (2) above, the Inventor have confirmed that the use of a rubber-like silicone resin instead of a gel-like silicone resin can remarkably improve the emission characteristics, reliability, mechanical strength, and so forth.

A technique for increasing the hardness of a silicone resin is to add an agent for giving a thixotropy index.

Upon burying a silicone resin, it is poured into the opening 105 of the resin stem through a thin nozzle, and thereafter cured. In this process, it is preferable to use a silicone resin having a pre-curing viscosity around 100 cp through 10000 cp. Thereby, it is possible to fully bury the opening including narrow spaces and to limit the residual stress upon curing within a sufficiently low range, without giving an excessive stress to the light emitting element 106 and the wire 109.

Based on the knowledge reviewed above, the Inventor prepared light emitting devices according to the embodiment as shown in FIG. 1 by using a rubber-like silicone resin having the pre-during viscosity of 1000 cp and post-curing JISA hardness value of 70, and carried out a temperature cycle test in the temperature range from −40° C. to 110° C. As a result, there occurred absolutely no problems of cracks or exfoliation of the sealing element 111 of a silicone resin, breakage or exfoliation of the light emitting element 106, breakage of the wire 109, etc. The temperature cycle test is still continued at the time of filing of the present application.

As explained above, it has been confirmed that the use of a silicone resin, in particular, a rubber-like silicone resin, reduces the possibility of cracks and exfoliation that often occurred in conventional epoxy resins, breakage of wires, and so on.

In addition, the Inventor has found that the optical output efficiency of the light emitting device can be improved by using the silicone resin. That is, the Inventor has found a substantially transparent resin material among the silicone resin, especially among the rubber-like silicone resin, which can be used in the present invention. By using such a transparent silicone resin, the optical output efficiency of the light emitted from the light emitting element 106 can be improved. As a result, a brighter light emitting device can be realized.

Further, the use of a silicone resin also improves the durability against light emitted from the semiconductor light emitting element 106 or light intruding from the exterior of the light emitting device. Epoxy resins change in color when exposed to light, and even if it is initially transparent, its optical transmittance decreases after long-time use.

This phenomenon is magnified as the wavelength of light becomes shorter. For example, in case the epoxy resin is exposed to ultraviolet rays, the originally transparent epoxy resin changes in color through yellow, liver to black. It may result in a serious decrease of the light extraction efficiency. Ultraviolet rays may intrude from the exterior of the light emitting device.

Through trials and reviews, the Inventor has found that the use of a silicone resin leads to a very satisfactory result. That is, if a silicone resin is used, change or color and other types of deterioration do not occur even after it is exposed to short wavelength light such as ultraviolet rays. That is, the silicone resin can maintain its initial transparent state for a long period. Therefore, silicone resins contribute to realization of light emitting devices exhibiting excellent resistance to light and weather, and contribute to keep a high external output efficiency for a long period.

In the light emitting device shown in FIG. 1, the resin portion 103 may be equipped with optical reflectivity. For example, the resin portion 103 may be made of 65 or more weight % of a thermoplastic resin and 35 or less weight % of a filling agent. The filling agent contains a high-reflective material such as titanium oxide ($TiO_3$), silicon oxide, aluminum oxide, silica or alumina. In case of titanium oxide, its content is in the range from 10 to 15%. Because the reflective surface 104 is a part of the resin portion containing a diffusing material that reflects light, it can reflect light from the light emitting element 106 and the fluorescent element 110 upward to realize a high luminance of the light emitting device. If the reflective surface 104 is configured as a paraboloid of revolution, for example, the output and the quality of the light emitting device can be further improved.

Heretofore, an embodiment of the invention has been explained with reference to FIG. 1. However, present invention is not limited to this specific example, but can be applied to all types of light emitting deices which has a structure where a semiconductor light emitting element is sealed by a resin.

Next explained are some of the other of the light emitting device according to the invention with reference to the drawings.

(second example)

Figure 2:
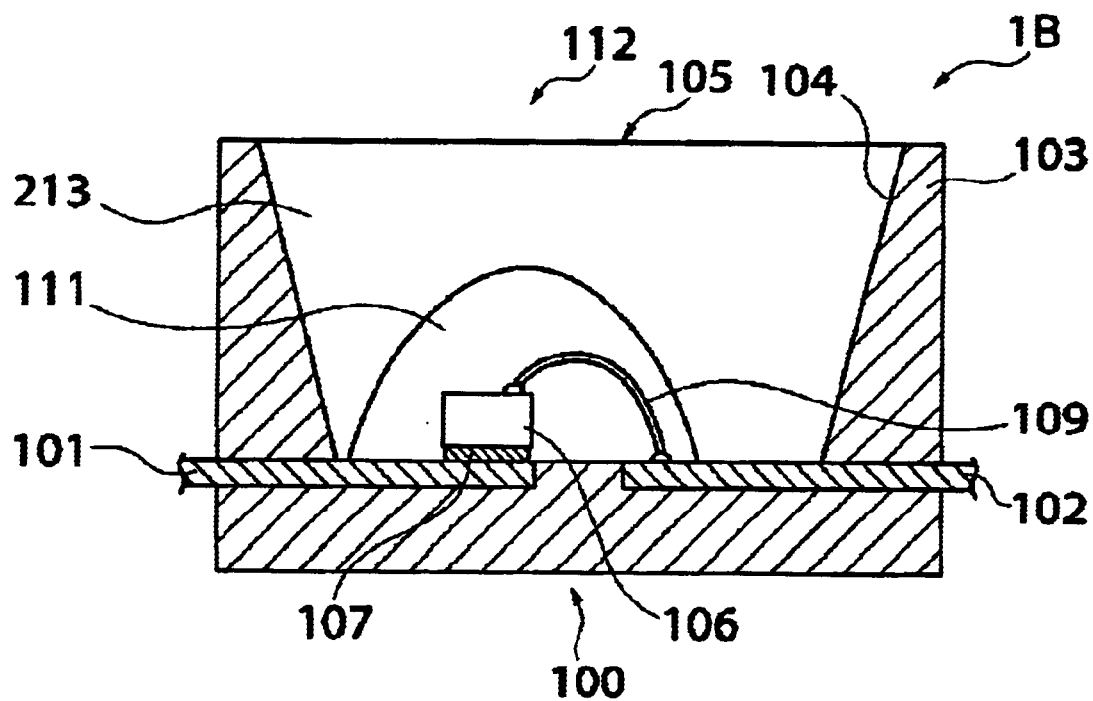
FIG. 2 is a cross-sectional view that schematically shows the second specific example of a light emitting device according to the embodiment of the invention.

FIG. 2 is a cross-sectional view that schematically shows the second specific example of the light emitting device according to the invention. Among components shown here, the same or equivalent components as those already explained with reference to FIG. 1 are commonly labeled, and their detailed explanation is omitted for simplicity.

The light emitting device 1B shown here also includes a resin stem 100, semiconductor light emitting element 106 mounted thereon, and sealing element 111 of a silicone resin provided to embed the element 106.

In this embodiment, however, the sealing element 111 merely embeds the light emitting element 106, and a second sealing element 213 of a transparent resin is provided outside the sealing element 111.

The second sealing element 213 may be made of an epoxy resin, silicone resin or any of other various materials. The second sealing element 213 may be colored, and any material adaptable to the dye or coloring agent used can be selected.

The second sealing element 213 may contain a diffusing material dispersed therein to scatter light. In this case, light can be diffused, and broader light distribution characteristics can be obtained.

If a silicone resin is used as the second sealing element 213, then its close contact with the sealing element 111 is enhanced, and the moisture resistance is improved.

In this specific example, the sealing element 111 made of a silicone resin wraps the entirety of the Au wire 109. Therefore, a reliable light emitting element free from breakage of wire due to a resin stress can be realized. If the wire partly projects into the second sealing element 213, it will readily break due to a stress produced at the interface between the sealing elements 111, 213. In this specific example, however, since the wire 109 is entirely embedded by the sealing element 111, it is free from breakage.

(third example)

Next explained is a third example of the invention.

Figure 3:
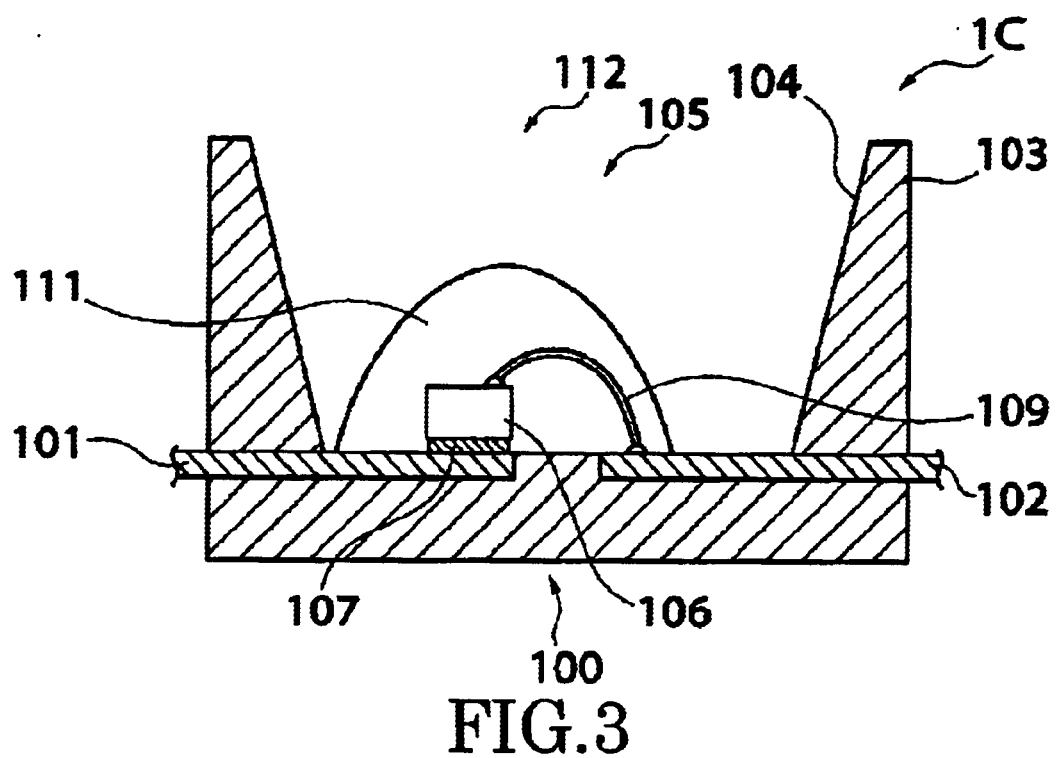
FIG. 3 is a cross-sectional view that schematically shows the third specific example of a light emitting device according to the embodiment of the invention.

FIG. 3 is a cross-sectional view that schematically shows the third specific example of the light emitting device according to the invention. Here again, the same or equivalent components as those already explained with reference to FIGS. 1 and 2 are commonly labeled, and their detailed explanation is omitted for simplicity.

The light emitting device 1C shown here also includes a resin stem 100, semiconductor light emitting element 106 mounted thereon, and sealing element 111 provided to embed the element 106.

Similarly to the second specific example, the sealing element 111 merely embeds the light emitting element 106. In this specific example, however, the space outside the sealing element 111 remains open, without being filled by any other sealing element.

Here again, the limitative use of the sealing element 111 only to enclose the light emitting element 106 mounted at the bottom of the opening 105 contributes to small-sizing the emitting portion. Therefore, the luminance increases, and the function of the reflective surface 104 to gather rays of light is enhanced.

Especially, in the instant specific example, since the approximately hemispheric sealing element 111 serves as the emission point, and the reflective surface 104 surrounds it, the same optically converging effect as a conventional lamp can be obtained.

Furthermore, similarly to the second specific example, since the sealing element 111 embeds the entirety of the Au wires 108, 109, it prevents breakage of wire by a resin stress, and ensures a high reliability.

(fourth example)

Next explained is a fourth example of the invention.

Figure 4:
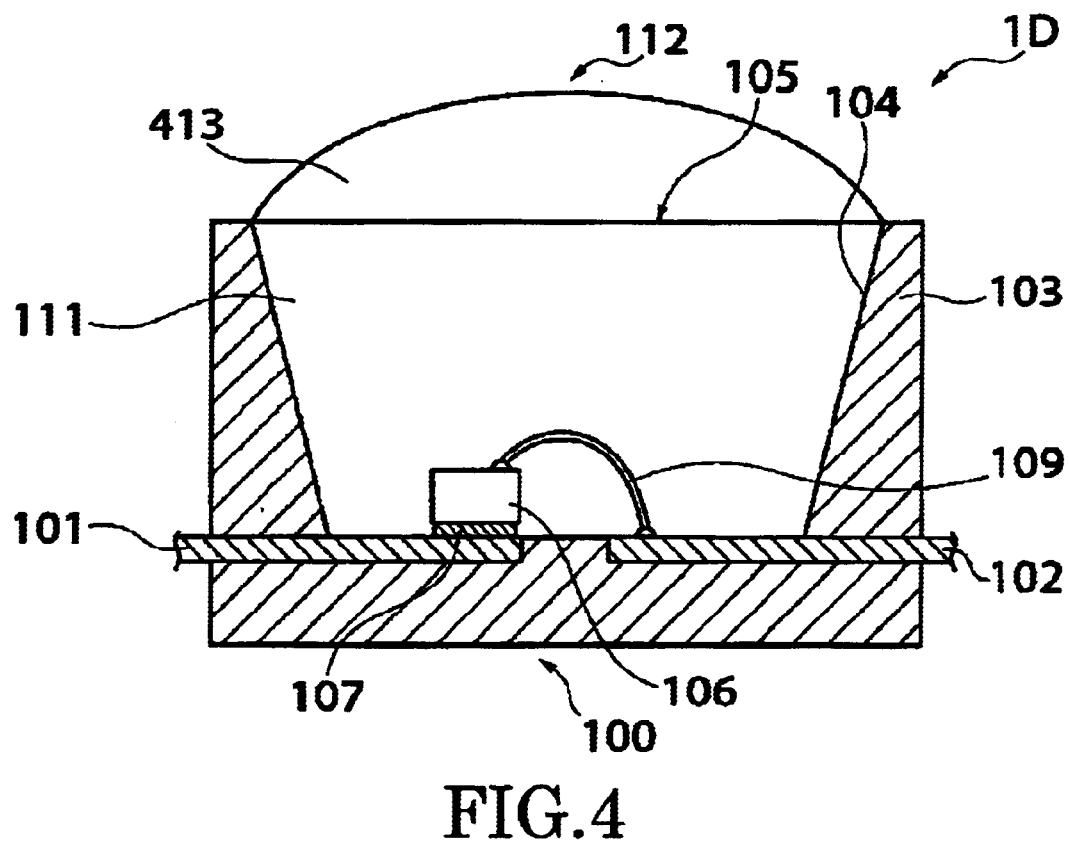
FIG. 4 is a cross-sectional view that schematically shows the fourth specific example of a light emitting device according to the embodiment of the invention.

FIG. 4 is a cross-sectional view that schematically shows the fourth specific example of the light emitting device according to the invention.

Similarly to the first specific example, the light emitting device 1D shown here also includes a resin stem 100, semiconductor light emitting element 106 mounted thereon, and sealing element 111 embedding the element 106.

The embodiment shown here includes a convex transparent element 413 is provided on the sealing element 111 to ensure the function of gathering rays of light. The transparent element 413 may be made of a resin, for example. Especially, a silicone resin is advantageous for decreasing the difference of the refractive index from the sealing element 111 and to reduce the loss by reflection at the interface with the sealing element 111.

The convex shape of the transparent element 413 is not limited to a spherical shape. Any appropriate shape can be selected depending on the required converging ratio or luminous intensity profile.

(fifth example)

Next explained is a fifth example of the invention.

Figure 5:
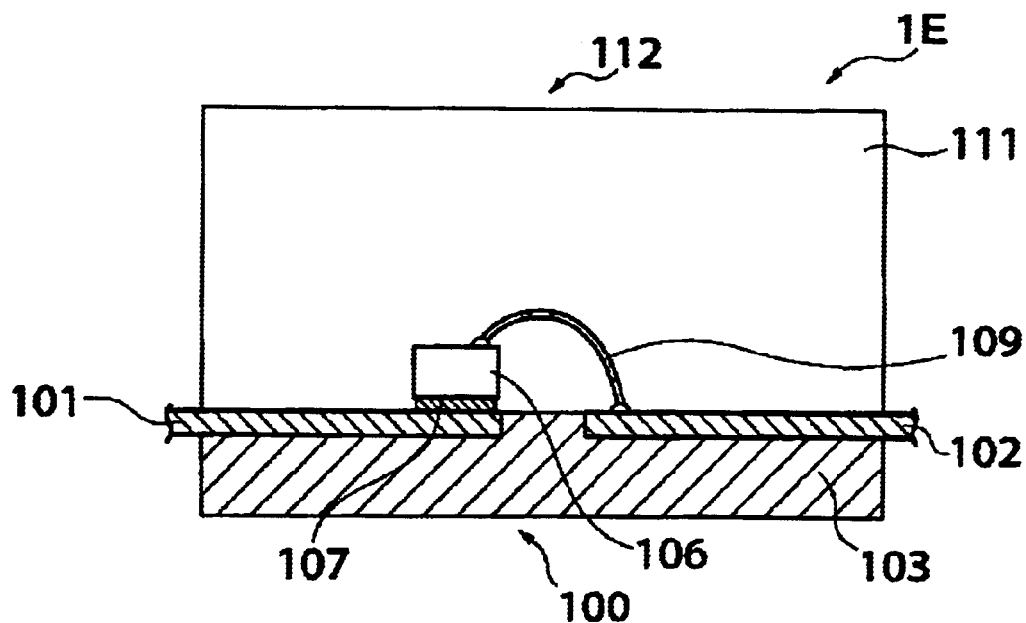
FIG. 5 is a cross-sectional view that schematically shows the fifth specific example of a light emitting device according to the embodiment of the invention.

FIG. 5 is a cross-sectional view that schematically shows a fifth example of a light emitting device of the invention. Here again, the same or equivalent components as those already explained with reference to FIGS. 1 through 4 are commonly labeled, and their detailed explanation is omitted for simplicity.

The light emitting device 1E shown here also includes a resin stem 100, semiconductor light emitting element 106 mounted thereon, and sealing element 111 embedding the stacked structure. The sealing element 111 is made of silicone resin having a hardness in a range from 50 through 90 in JISA value.

In the instant embodiment, however, the resin portion 103 has no side wall around the sealing element 111 such that the light from the element 106 both upwardly and laterally to realize a wide luminous intensity profile. This is suitable for applications expected to provide a wide field of view or a wide field of emission.

Figure 6:
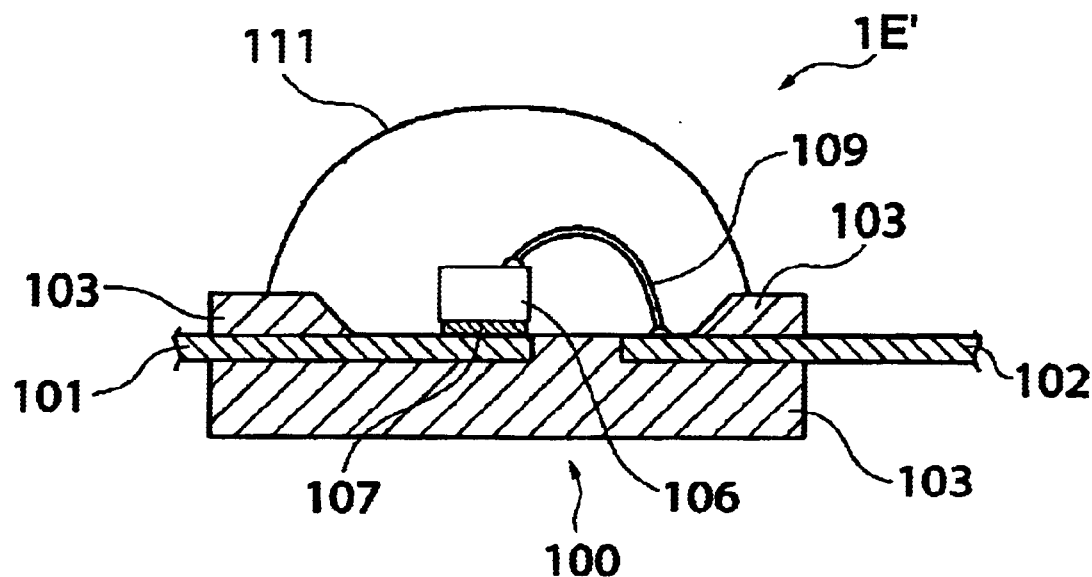
FIG. 6 is a cross-sectional view that schematically shows the another version of the fifth specific example of a light emitting device according to the embodiment of the invention.

Shapes of the sealing element and the resin stem 100 are not limited to those illustrated. For example, the sealing element may be hemispherical as shown in FIG. 6, and the resin stem 100 may have a resin portion 103 configured to bury the leads 101, 102 and surround the element with a low side wall.

(sixth example)

Next explained is a sixth example of the invention.

Figure 7:
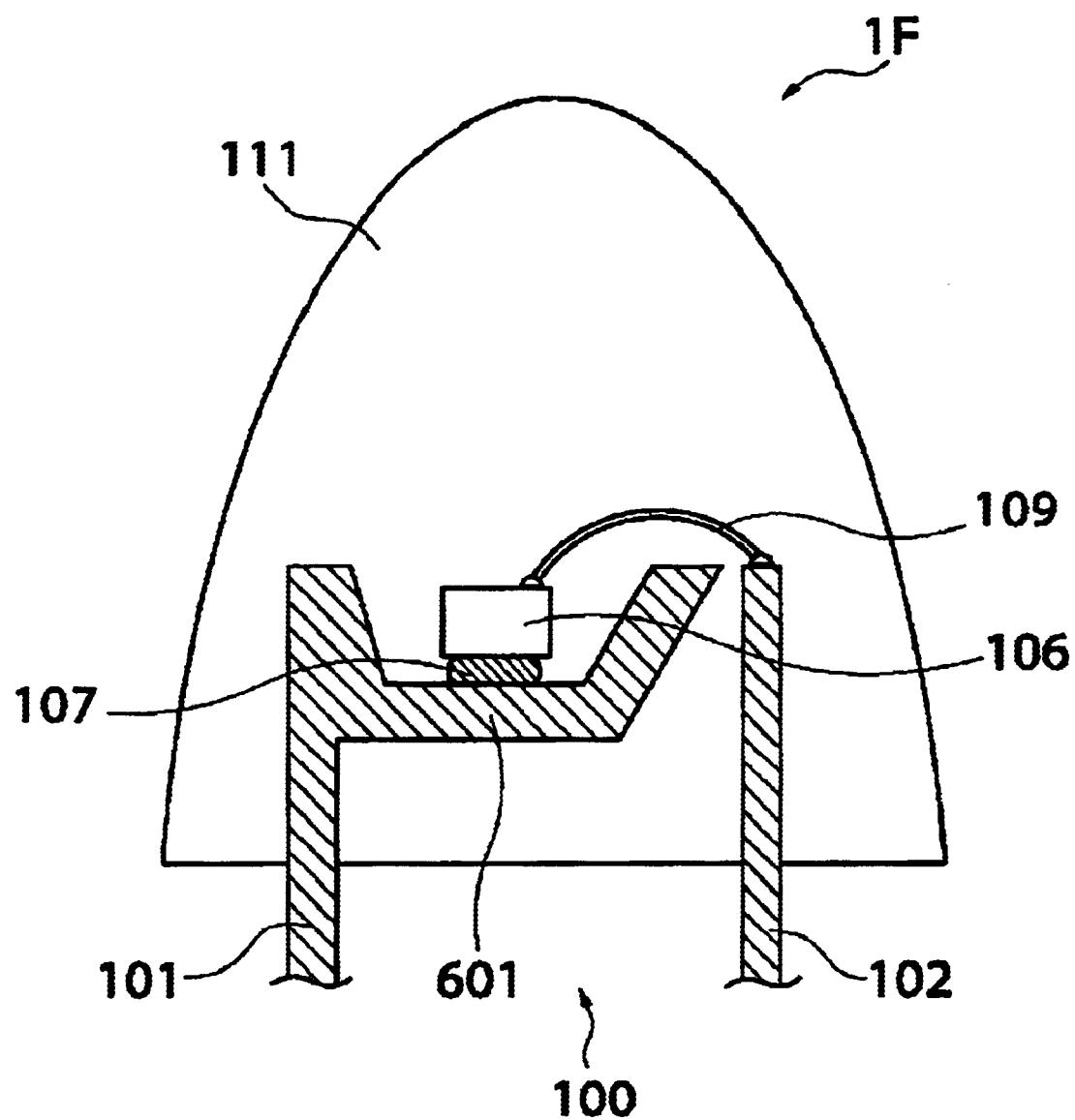
FIG. 7 is a cross-sectional view that schematically shows the sixth specific example of a light emitting device according to the embodiment of the invention.

FIG. 7 is a cross-sectional view that schematically shows a sixth example of a light emitting device according to the invention. Here again, the same or equivalent components as those already explained with reference to FIGS. 1 through 6 are commonly labeled, and their detailed explanation is omitted for simplicity.

The light emitting device 1F shown here also includes a pair of leads 101, 102. However, the first lead 101 has formed a cup portion 601 at the distal end, and the stacked structure including the light emitting element 106 is mounted at the bottom of the cup portion 601. Then the wire 109 extending from the element 106 is connected to the lead 102. The sealing element 111 is formed to embed these components. The sealing element 111 is made of silicone resin having a hardness in a range from 50 through 90 in JISA value.

The inner sidewall surface of the cup portion 601 serves as the reflective surface to reflect the primary light from the light emitting element 106 upwardly. The transparent sealing element 111 can function as a convex lens to converge the light emitted from the element 106.

The light emitting device shown here replaces conventional lamp-type semiconductor devices, and is operative as a general-purpose light emitting device having a relatively wide field of emission.

(seventh example)

Next explained is a seventh example of the invention.

Figure 8:
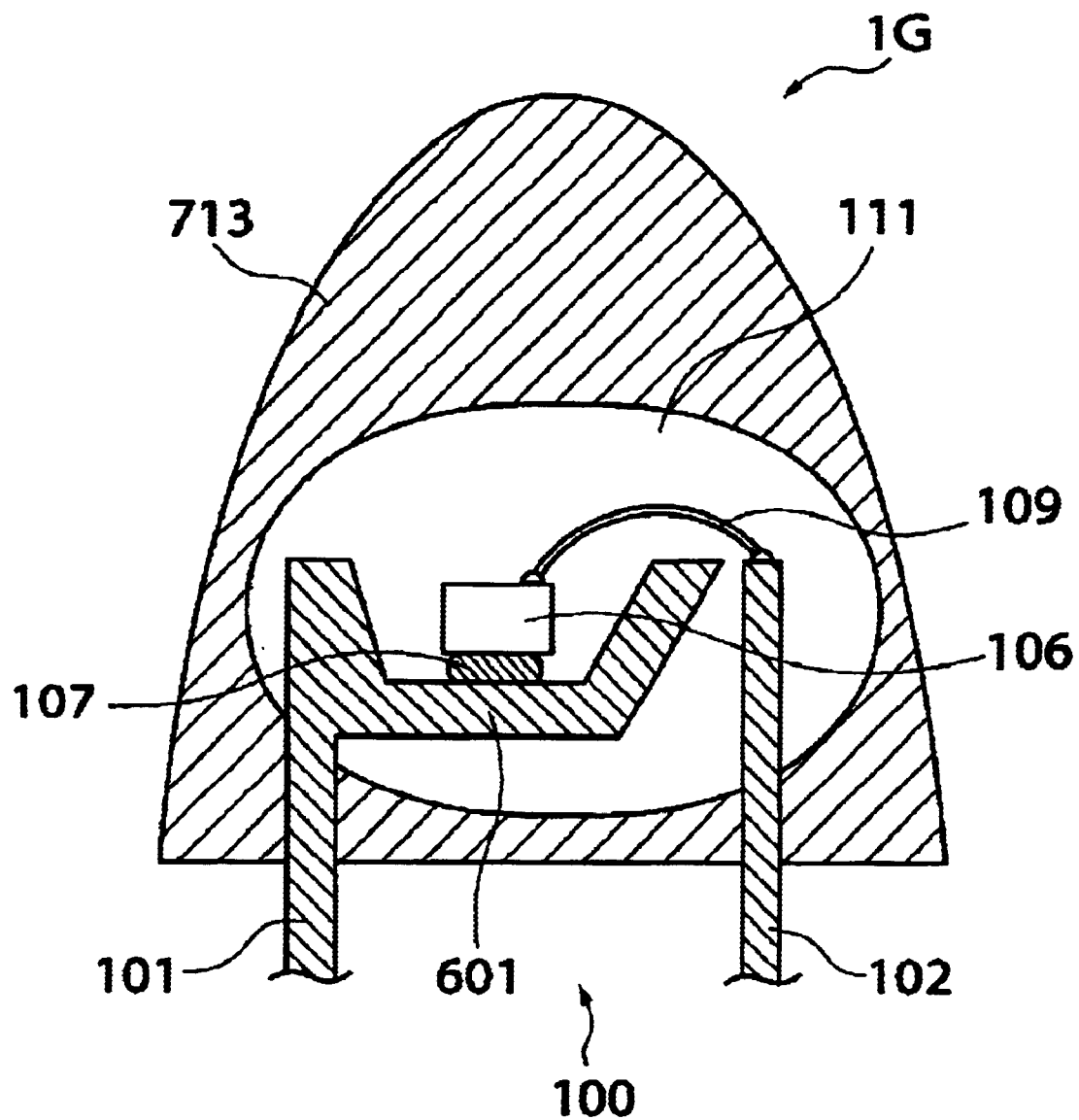
FIG. 8 is a cross-sectional view that schematically shows the seventh specific example of a light emitting device according to the embodiment of the invention.

FIG. 8 is a cross-sectional view that schematically shows a seventh example of a light emitting device according to the invention. Here again, the same or equivalent components as those already explained with reference to FIGS. 1 through 7 are commonly labeled, and their detailed explanation is omitted for simplicity.

The light emitting device 1G shown here has a structure similar to the light emitting device 1F shown in FIG. 7. The light emitting device 1G also has a cup portion 601 at the distal end of the first lead 101, and the light emitting element 106 is mounted at the bottom thereof. Then the wire 109 from the element 106 is connected to the lead 102. The sealing element 111 is made of silicone resin having a hardness in a range from 50 through 90 in JISA value. The sealing element 111 is provided to embed those components.

In the instant embodiment, however, the sealing element 111 is small-sized, and a transparent element 713 is provided to enclose the sealing element 111.

The small-sized sealing element 111 diminishes the emission portion and increases the luminance. The top surface of the transparent element 713 functions as a lens to gather rays of light, and makes it possible to extract converged light as well.

The transparent element 713 enclosing the sealing element 111 isolates the element 111 from the outside atmosphere and improves its durability against moisture and corrosive atmosphere. The transparent element may be made of a resin. Especially, an epoxy resin or silicone resin is advantageous for close contact with the sealing element 111 to enhance the resistance to whether and the mechanical strength.

Figure 9:
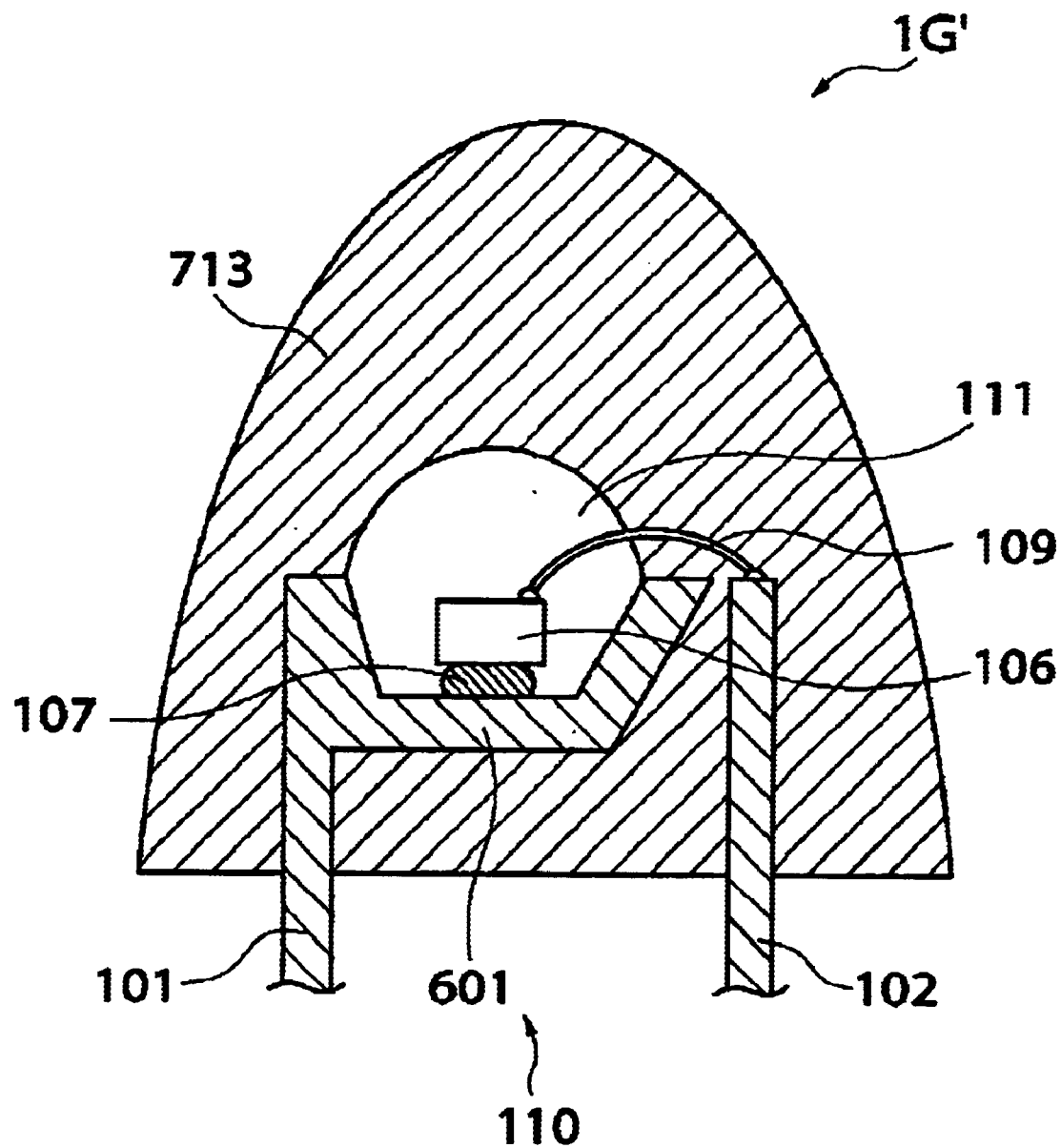
FIG. 9 is a cross-sectional view that schematically shows the another version of the seventh example of a light emitting device according to the embodiment of the invention.
Figure 10:
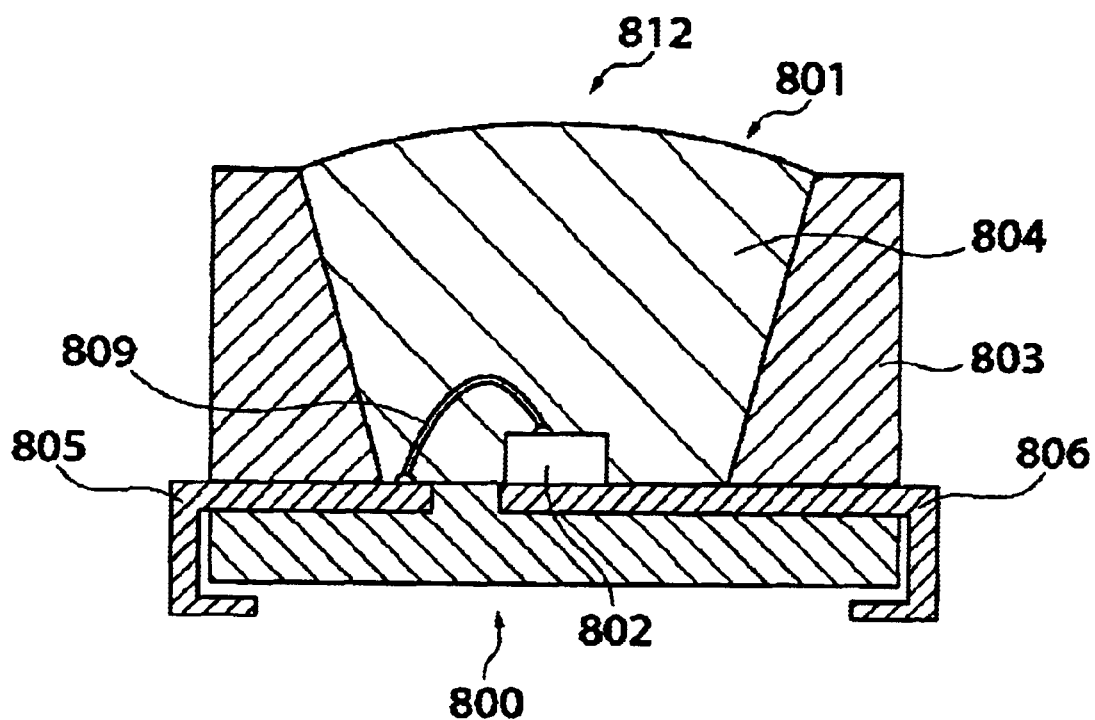
FIG. 10 shows schematic cross-sectional view of a typical conventional light emitting device.
Figure 11:
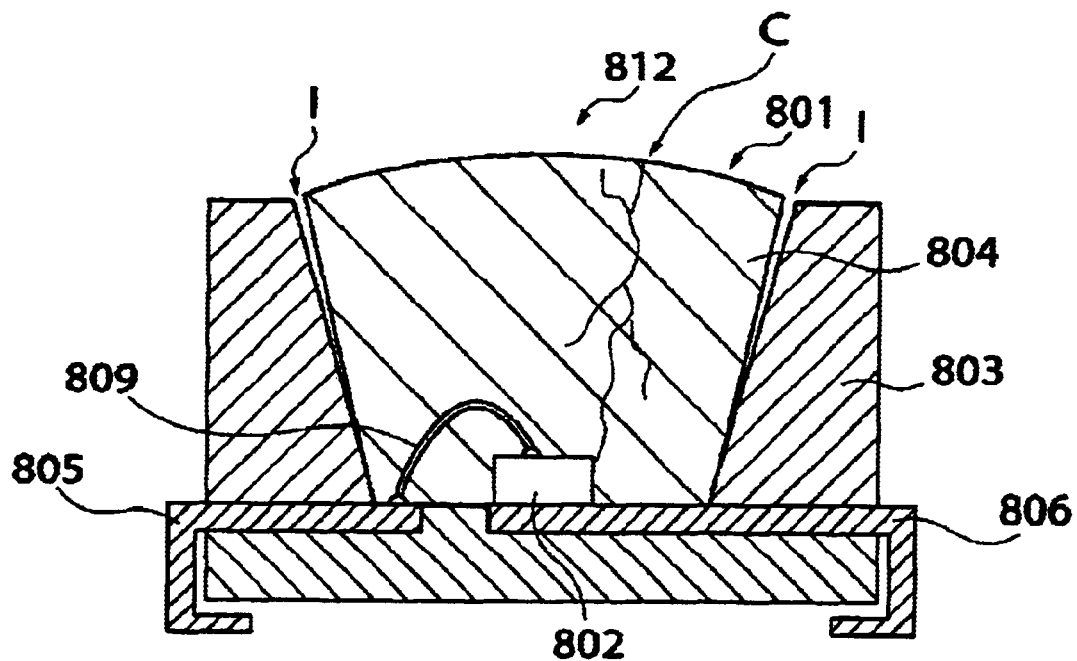
FIG. 11 is a schematic diagram that shows the cracks C are produced in an epoxy resin 804 and how exfoliation occurs at the interface I with the resin stem 800.

The embodiment shown here is not limited to the illustrated example. For example, as shown in FIG. 9, the sealing element 111 may be limited only on the cup portion 601 to reduce the size of the emission portion and thereby increase the luminance. In this case, the wire 109 will extend beyond the boundary between the sealing element 111 and the transparent element 713. However, if the sealing element 111 and the transparent element 713 are made of similar materials, the stress at the boundary will be minimized and will prevent breakage of wire.

Heretofore, various embodiments of the invention have been explained with reference to specific examples. The invention, however, is not limited to those examples. Rather, the invention should be construed to include various changes and modifications an ordinary skilled person can make regarding, for example, structures and materials of the light emitting element, shapes of the leads and the sealing element 111, dimensional relations among components, and so on.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A light emitting device comprising:
   a semiconductor light emitting element; and
   a silicone resin provided to embed said semiconductor light emitting element, said silicone resin having a hardness not lower than 50 in Japanese Industrial Standards Shore A (JISA) value and not higher than 90 in the JISA value,
   wherein said silicone resin has a pre-curing viscosity in the range not lower than 100 centi-poise (cp) and not higher than 10000 cp,
   wherein said silicone resin is substantially transparent to a light emitted from said semiconductor light emitting element.

2. A light emitting device according to claim 1, further comprising a wire connected to said semiconductor light emitting element,
   said silicone resin being provided to embed said wire as well.

3. A light emitting device according to claim 1, further comprising a resin stem having a pair of leads and a resin portion burying at least a part of said pair of leads,
   said semiconductor light emitting element being mounted on one of said pair of leads.

4. A light emitting device according to claim 3, wherein said resin portion has an opening,
   said semiconductor light emitting element being mounted on one of said pair of leads at the bottom of said opening,
   said silicone resin being provided in said opening.

5. A light emitting device according to claim 3, wherein said resin portion is made of a thermoplastic resin.

6. A light emitting device according to claim 4, wherein said opening has an inner side wall which inclines to face toward the open end,
   said resin portion containing a material which reflects visible light.

7. A light emitting device according to claim 1, wherein said silicone resin contains an agent for giving a thixotropy index.

8. A light emitting device according to claim 3, wherein said silicone resin contains 35 or less weight percent of a filling agent.

9. A light emitting device according to claim 8, wherein said filling agent contains at least one selected from the group consisting of titanium oxide, silicon oxide, aluminum oxide, silica and alumina.

* * * * *